United States Patent [19]

Shikhirev et al.

[11] 4,040,209
[45] Aug. 9, 1977

[54] DEVICE FOR THE TREATMENT OF SHEET MATERIALS

[76] Inventors: Boris Nikolaevich Shikhirev, Novo-Alexeevskaya ulitsa, 1, kv. 146; Evgeny Arkadievich Matrosov, 2 Filevskaya ulitsa, 10/13, korpus 1, kv. 64; Ilya Abramovich Deresh, Krasnokholmskaya Naberezhnaya, 1/15, kv. 343, all of Moscow, U.S.S.R.

[21] Appl. No.: 629,631

[22] Filed: Nov. 6, 1975

[30] Foreign Application Priority Data

Nov. 15, 1974 U.S.S.R. .............................. 2077025

[51] Int. Cl.² .............................................. B24B 7/12
[52] U.S. Cl. ...................................... 51/80 A; 51/317
[58] Field of Search .................. 51/9 R, 80 A, 80 R, 51/75, 76, 263, 292, 317

[56] References Cited

U.S. PATENT DOCUMENTS

| 588,441 | 8/1897 | Kann | 51/292 |
|---|---|---|---|
| 1,899,463 | 2/1933 | Howard | 51/80 A |
| 2,483,277 | 9/1949 | Hamilton | 51/80 A |
| 3,898,769 | 8/1975 | Makedonski | 51/292 |

*Primary Examiner*—Al Lawrence Smith
*Assistant Examiner*—Nicholas P. Godici
*Attorney, Agent, or Firm*—Lackenbach, Lilling & Siegel

[57] ABSTRACT

A device for the treatment of sheet materials comprises two cylindrical rolls from a magneto-conducting material and electromagnets which are positioned relative to these rolls so that they form, together with the electromagnets, a single magnetic system, wherein one roll has one polarity and the other roll has an opposite polarity. Under the effect of this field the particles of an abrasive material are orientated and retained on the external surface of the rolls, forming a brush, as a result of which a sheet material, when passing through a gap, is subject to treatment from both sides.

4 Claims, 4 Drawing Figures

DEVICE FOR THE TREATMENT OF SHEET MATERIALS

The present invention relates to devices for the abrasive treatment of sheet materials and more particularly to devices for treating sheet materials by ferromagnetic abrasive powder and can be most successfully used for treating blanks of printed-circuit cards or boards for different radioelectronic circuits. In addition, the present invention can be successfully used also in other fields of technology where sheet materials with high quality of treatment of their surfaces are required.

Known in the art are various devices for treating sheet materials by ferromagnetic abrasive powder. Such devices comprise a magnetic system which induces a magnetic field retaining particles of ferromagnetic abrasive powder in a particular orientated position. These devices comprise a means for feeding sheet materials to be treated to a zone where said particles are supplied. Thus, French Pat. No. 1,507,495 dated Jan. 4, 1967, discloses a similar device for treating sheet materials. This device comprises a bunker with ferromagnetic powder and a magnetic system arranged opposite the bunker's open side. The magnetic system represents by itself an electromagnet and a collector. A roller conveyor is provided between the bunker and the electromagnet to ensure a repeated passing of a sheet through a zone of treatment for interaction with the particles. A reciprocating movement is imparted to said sheet, and under the action of compressed air the ferromagnetic powder is fed, through a nozzle, from the bunker to one of the sheet's sides. Under the effect of a magnetic field the powder rushes towards the sheet's surface, impacts upon it with a preset force and deforms the sheet's unevennesses.

A disadvantage of such a device consists in that it can be used for treating sheet materials only from one side, as the other side of the sheet is not within reach of the abrasive material or particles. Besides, said device cannot be used for treating thin and small blanks of a type of printed-circuit cards or foil, in view of the fact that these blanks are deflected because of their low rigidity.

Accordingly, a main object of the present invention is to provide for the treatment of sheet materials from both sides, i.e., of both surfaces of said sheet materials.

Another object of the present invention is to improve the quality of treatment of sheet materials.

Among other objects of the present invention it should be mentioned is the improvement of reliability of the operation of said device for the treatment of sheet materials.

The and other objects of the invention are achieved by a device for treating sheet materials by ferromagnetic abrasive powder, comprising a magnetic system for retaining said abrasive powder in a zone of treatment and a mechanism for feeding said sheets to this zone, wherein, according to the invention, said magnetic system for retaining said abrasive powder is formed by two rolls made from a magneto-conducting material which rolls are arranged with a gap to enable a sheet to be treated to pass between them and which rolls are mounted so as to rotate in opposite directions at substantially equal speeds; said magnetic system is also formed by a facility for inducing a magnetic field with a magnetic conductor positioned at least at one side of the butt ends of said rolls in such a way that power lines of said magnetic field run along the axis of the rolls and cross the gap between them; one of said rolls is one pole of the magnetic system, while the other roll is the other pole of the same magnetic system, as a result of which particles of said abrasive powder are retained in the gap between the rolls.

The advantage of the inventive device is that it ensures the simultaneous treatment of both surfaces of a sheet material; in addition, it should be pointed out that the proposed orientation of a magnetic field ensures uniform distribution of the particles of ferromagnetic abrasive powder within the entire gap, which, in its turn, ensures high quality of the treatment of sheet materials.

To prevent discharge of the particles of said abrasive material from a zone of treatment, screens are provided from the outside of said rolls.

In an embodiment of the invention an electromagnetic coil is provided at each of the rolls' butt ends, and in a pair of coils, relating to one and the same roll, the coils are counterconnected, as a result of which one roll has one polarity, while the other roll has an opposite polarity.

The rolls can be made cylindrical and can have grooves on their external surface, going along a helix or along a generatrix of said cylindrical rolls.

The grooves enable an abrasive material to pass along the rolls from one end to the other.

And, finally, it is expedient to provide for a facility for batched feeding of ferromagnetic abrasive powder. This device, according to the embodiment of the invention, is provided with said facility for batched feeding of said abrasive powder, comprising a means for producing pulp from said powder and coolant, a pipe line for feeding said pulp to a zone of treatment, which pipe line communicates with said zone near one of the butt ends of the rolls, and a pipe line for discharging the used pulp, which pipe line is positioned at the opposite butt end of the rolls.

The nature of the invention will be clear from the following detailed description of the embodiment of the device for treating sheet materials by ferromagnetic abrasive powder, according to the invention and the accompanying drawings, in which FIG. 1 illustrates schematically in cross-section a preferred embodiment of the device for treating sheet materials;

Figures 1, 2:
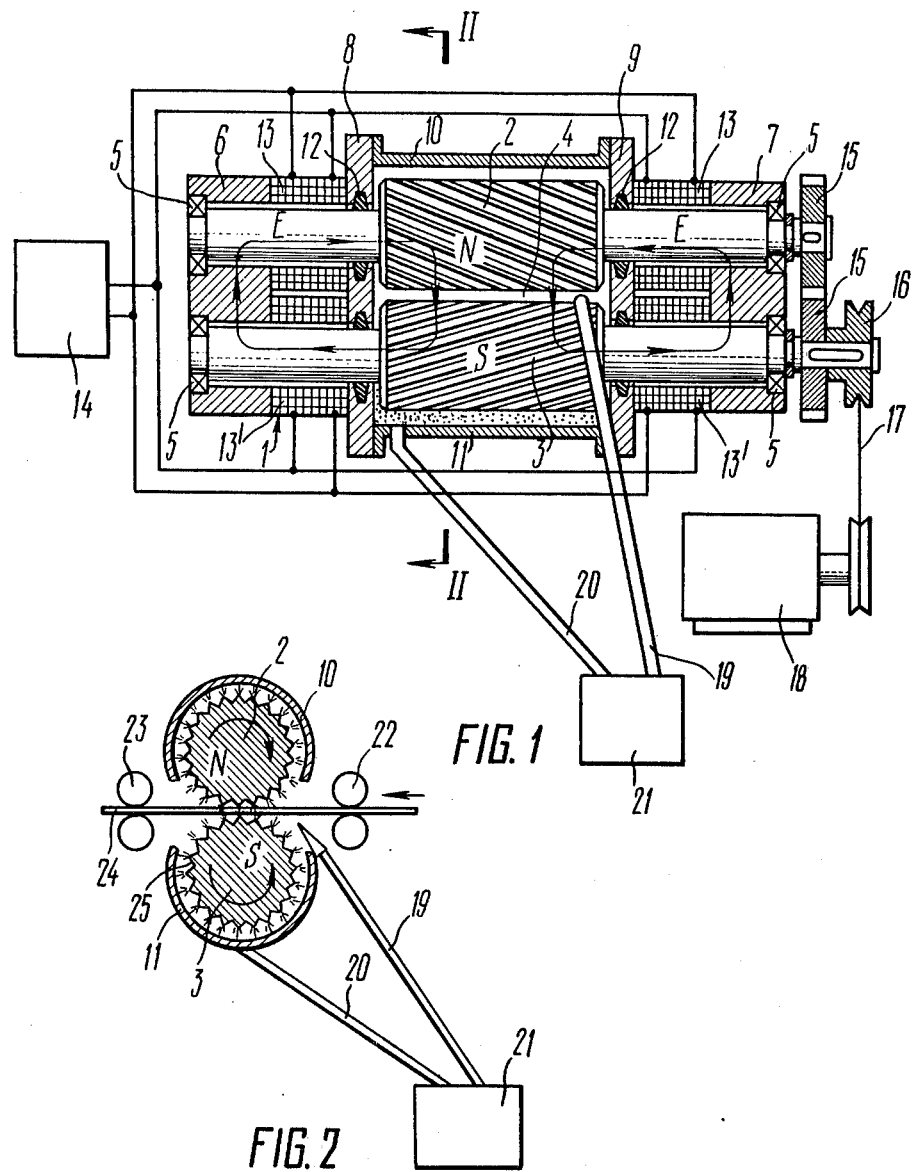
FIG. 2 is a sectional view taken along the line II—II of FIG. 1.

Let us see FIG. 1 where the device for the treatment of sheet materials by ferromagnetic abrasive powder is shown as a whole by the reference number 1.

This device comprises cylindrical rolls 2 and 3 made of a material with high magnetic permeability, for example, of steel. Said rolls 2 and 3 are mounted with a gap 4 on bearings 5 in casings 6 and 7, which casings are also made of a material with high magnetic permeability, for example, of steel. As it will be shown below in greater detail, powder and a sheet to be treated are fed into said gap 4 which serves as a zone of treatment.

To the left of said roll 2 and to the right of said rolls 2 and 3, at some distance from them, flanges 8 and 9 are mounted, correspondingly; said flanges are made of a non-magnetic material, e.g., aluminium. To the flanges are secured details 10 and 11 which serve as screens, preventing discharge of said abrasive powder, and which are described below in greater length.

The screens 10 and 11, as best shown in FIG. 2, have a cylindrical shape corresponding to the equidistant periphery of the rolls. Flanges 8 and 9 are provided with suitable seals 12. Electromagnetic coils 13 and 13' having frames (not shown) are fixed to said flanges 8 and 9 and are mounted between said casings 6 and 7 and said flanges 8 and 9. These coils are connected to a common source 14 of direct current; the coils relating to the roll 2 are counter-connected one with respect to the other, as a result of which the roll 2 is one pole of a magnetic system, e.g., N. The coils relating to the roll 3 are likewise counter-connected, with the roll 3 being the other pole of said magnetic system, e.g., S. Thus, said magnetic system for retaining said abrasive powder is formed by the two cylindrical rolls made from a magneto-conducting material, which rolls are arranged with a gap to enable a sheet to be treated to pass between them and which rolls are mounted so as to rotate in opposite directions. The magnetic system is also formed by a facility for inducing a magnetic field with a magnetic conductor, positioned at least at one side of the butt ends of said rolls in such a way that power lines of said magnetic field pass in the direction of the rolls' axes and cross the gap between them. One of said rolls is one pole of the magnetic system, while the other roll is the other pole of the same magnetic system, as a result of which particles of said abrasive powder are retained in the gap between said rolls. Secured to said rolls 2 and 3 are gears 15 and a pulley 16 which is linked via a belt 17 with an electric motor 18, which results in said rolls being rotated in the opposite direction at an equal speed. A pipe line 19 for feeding said abrasive powder is secured to one of the butt ends of rolls 2 and 3, while a pipe line 20 for discharging the used abrasive powder is secured to the opposite butt ends of said rolls 2 and 3. The pipe lines are connected to suitable pump means, such as a jet-type pump 21. To the right of the rolls 2 and 3 (see FIG. 2) there are provided feeding rollers 22, and to the left of said rolls there are provided receiving rollers 23. Said rollers 22 and 23 are intended for feeding a sheet 24 to a zone of treatment. On their external surface said rolls 2 and 3 have grooves 25, going along a helix. Such grooves ensure both an increase in concentration of said magnetic field and displacement of said abrasive powder from one butt end of the rolls 2 and 3 to the other butt end of the same rolls.

Let us consider the operation of the device in FIGS. 1 and 2.

Direct current which induces a magnetic flux in said rolls 2 and 3 is fed from said power supply source 14 to said coils 13. Said magnetic flux is closed so, as is shown by arrows E. Due to the fact that the coils are counter-connected, the roll 2 is one pole of the magnetic system, e.g., N, while the roll 3 is the other pole of this system, e.g., S. Said magnetic flux crosses said air gap 4, wherein high magnetic field intensity is created. The ejector-type pump 21 feeds pulp made from abrasive powder and coolant to one butt end of said rolls 2 and 3 through the pipe line 19. The electric motor 18 is switched on, which motor rotates the rolls 2 and 3. Under the effect of said magnetic field said ferromagnetic powder, which is fed into the gap, forms a so-called "elastic brush". Owing to the fact that the grooves 25 are arranged on the surface of said rolls 2 and 3 along helixes, said abrasive powder is transferred from one butt ends of the rolls to the other butt ends. A drive (not shown in the drawing) of the rollers 22 and 23 is switched on, and the sheet blank 24 is fed into the gap 4 between the rolls 2 and 3. Under the effect of said magnetic field the elastic brushes contacting with the rolls 2 and 3 exert pressure upon both sides of the sheet 24, accomplishing the treatment of its surfaces. The screens 10 and 11 prevent discharge of the powder from the rolls. The used abrasive powder returns to a tank of the pump 21 through the pipe line 20.

In FIG. 2, there is shown schematically another embodiment of the device for the treatment of sheet materials, specifically, a band.

Figures 3, 4:
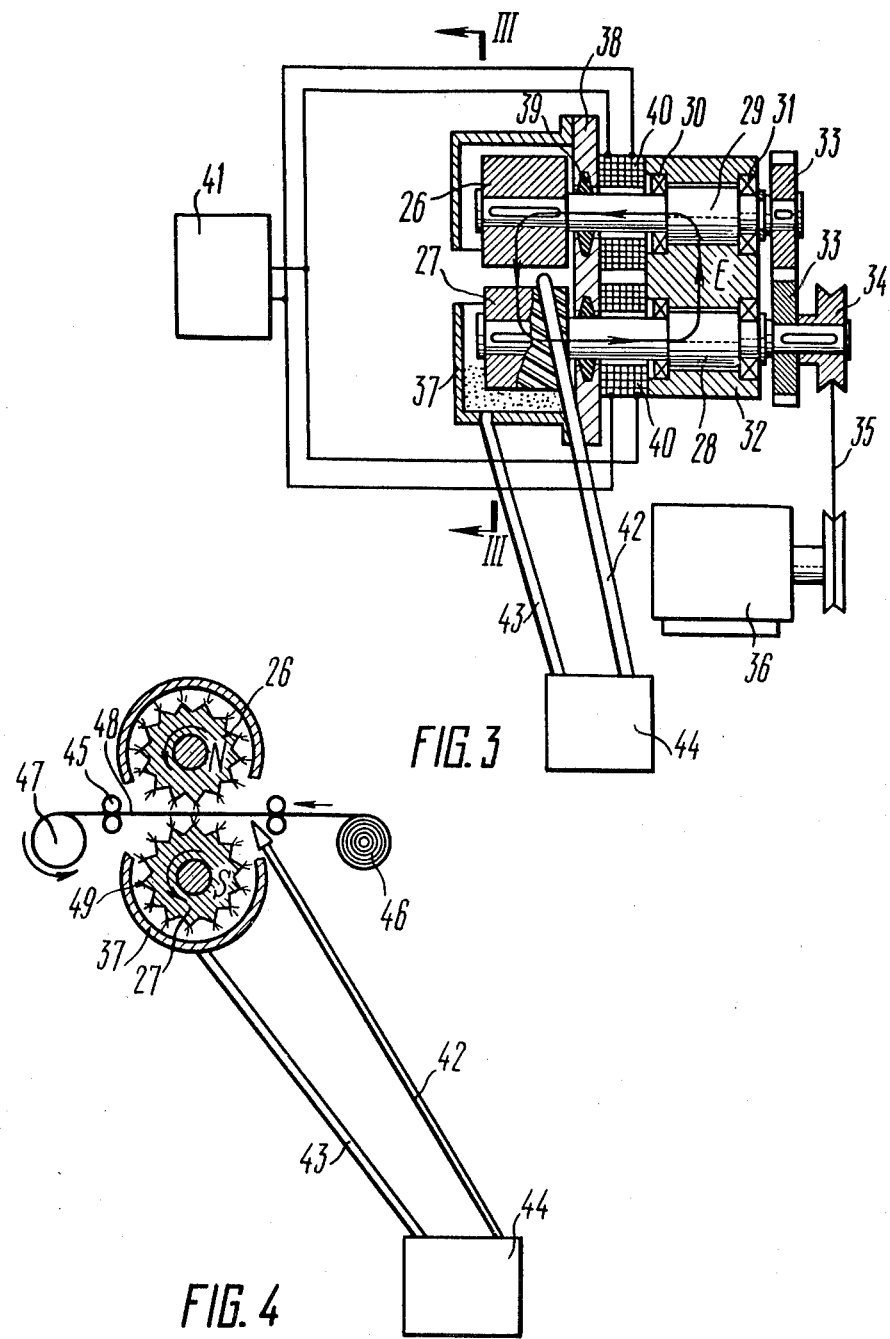
FIG. 3 is a view similar to that of FIG. 1, but of another embodiment of the invention.
FIG. 4 is a sectional view taken along the line III—III of FIG. 3.

A device in FIG. 3, as distinct from the above-described device, is characterized in that rolls 26 and 27 are secured to axles 28 and 29 so as to be capable of being detached or adjusted, if desired. This is necessary for changing the gap between the rolls depending on a change in their diameters. The axles 28 and 29 are mounted on bearings 30 and 31 in a casing 32. The rolls 26 and 27 are conjugated one with the other by means of gears 33. Secured to said roll 27 is also a pulley 34 linked with an electric motor 36 via a belt 35, as a result of which the rolls rotate in the opposite direction at an equal speed. Mounted over said rolls 26 and 27 are screens 37 fastened to a flange 38, which flange has seals 39. Two electromagnetic coils 40 are mounted between the flange 38 and the casing 32, to the right of butt ends of the rolls 26 and 27 only. The coils 40 are connected to a common source 41 of direct current in the same way, as in FIG. 1, therefore the roll 26 is one pole of the magnetic system, while the roll 27 is the other pole of the same magnetic system. A pipe line 42 for feeding of abrasive powder is secured to one of the butt ends of said rolls 26 and 27, while a pipe line 43 for discharge of the used powder is secured to the opposite butt ends of the rolls 26 and 27, and the pipe lines are connected to a pump 44. Guide rollers 45 and coils 46 and 47 with a band 48 to be treated are mounted at both sides of the rolls 26 and 27 (see FIG. 4). The rolls 26 and 27 also have grooves 49 arranged in the form of helixes.

The device in FIG. 3 and FIG. 4 essentially operates in the same way, as the device in FIG. 1 with the only difference being that the band 48 is fed continuously from the coil 46 to the coil 47.

The device may have different modifications. Thus, for example, said pulp-feeding system can be withdrawn, and, instead of this, abrasive powder is to be fed directly under the roll 3 in FIGS. 1 and 2 and under the roll 27 in FIG. 3 and 4. In this case, when the rolls are put into action, said abrasive ferromagnetic powder will be taken by grooves and uniformly distributed over the surface of said roll 2 and said roll 26; under the effect of a magnetic field said powder will be attracted to said rolls and uniformly distributed on cylindrical surfaces.

Instead of the above-described electromagnets, big-power permanent magnets can be used.

Grooves can be arranged not only along helixes, as is shown, but also along generatrixes of the rolls' cylindrical surfaces (not shown in the drawings). This makes it possible to effect the treatment of sheet materials by a dry method, i.e., without feeding abrasive powder jointly with coolant.

The efficiency and quality of treatment depends on the value of pressure, sharpness of the edges of powder particles, the rolls's rotation velocities and the longitudinal displacement of sheet blank. The pressure of said powder on the surface of a sheet depends on the intensity of the magnetic field in the operating gap, grain size of ferromagnetic powder and its magnetic conductivity.

The herein-proposed invention allows treatment sheet materials having a thickness of 0.01 mm and bigger, with surface finish up to class 12.

What we claim is:

1. A device for treating sheet materials by a ferromagnetic abrasive powder comprising: a pair of cylindrical rolls of a magneto-conducting material adapted to rotate in opposite directions and arranged with a gap therebetween to enable the sheet being treated to pass between said rolls; said rolls having grooves formed on their external surfaces; means for feeding said abrasive powder into the gap between said rolls; means for inducing a magnetic field in the gap between the rolls so as to form a treating zone or area including a magnetic circuit located at least on one side of the ends of both said rolls so that the magnetic lines of the magnetic field pass along the axes of rotation of the rolls and cross the gap between them, so that said magnetic circuit and said rolls form a magnetic system wherein one roll constitutes one poll of the magnetic system and the second roll of said pair of rolls constitutes the other poll of the same system; the particles of said abrasive powder being retained in the zone of treatment by the action of the magnetic field of said system; a drive for rotating said rolls at substantially equal speed; and means for feeding the sheet material being treated into said gap between the rolls.

2. A device of claim 1, which comprises two electromagnets arranged at the opposite butt ends of the rolls; in this case each electromagnet has two electromagnetic coils positioned at a butt end of one and the other roll, correspondingly; and in a pair of coils, relating to one and the same roll, said coils are counter-connected, as a result of which one roll has one polarity, while the other roll has opposite polarity.

3. A device of claim 1, wherein said grooves are arranged along a helixline.

4. A device of claim 1, wherein said grooves are arranged along a generatrix of the cylindrical rolls.

* * * * *